(12) United States Patent
Liu et al.

(10) Patent No.: US 11,719,966 B2
(45) Date of Patent: Aug. 8, 2023

(54) TEST STRUCTURE, SUBSTRATE AND METHOD FOR MANUFACTURING SUBSTRATE

(71) Applicants: HKC CORPORATION LIMITED, Shenzhen (CN); CHONGQING HKC OPTOELECTRONICS TECHNOLOGY CO., LTD., Chongqing (CN)

(72) Inventors: Kaijun Liu, Chongqing (CN); En-Tsung Cho, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 133 days.

(21) Appl. No.: 17/418,255

(22) PCT Filed: Mar. 6, 2020

(86) PCT No.: PCT/CN2020/078121
§ 371 (c)(1),
(2) Date: Jun. 25, 2021

(87) PCT Pub. No.: WO2020/199848
PCT Pub. Date: Oct. 8, 2020

(65) Prior Publication Data
US 2022/0091448 A1  Mar. 24, 2022

(30) Foreign Application Priority Data

Apr. 4, 2019 (CN) .......................... 201910270645.X (51) Int. Cl.
*G02F 1/13* (2006.01)
*G01N 23/2251* (2018.01)
(Continued)

(52) U.S. Cl.
CPC ....... *G02F 1/1309* (2013.01); *G01N 23/2251* (2013.01); *G01N 27/205* (2013.01);
(Continued)

(58) Field of Classification Search
CPC ............ G02F 1/1309; G02F 1/136254; G01N 23/2251; G01N 27/205; G01N 27/20;
(Continued)

(56) References Cited

U.S. PATENT DOCUMENTS 5,900,645 A * 5/1999 Yamada ............... H01L 22/34
257/E21.531
10,997,881 B2 * 5/2021 Shin .................... H01L 51/0097
(Continued)

FOREIGN PATENT DOCUMENTS

CN      1183640 A    6/1998
CN    103346142 A   10/2013
(Continued)

OTHER PUBLICATIONS

Lijuan Zhen, the ISA written comments, dated May 2020, CN.
Lijuan Zhen, the International Search Report, dated May 2020, CN.

*Primary Examiner* — Feba Pothen (57) ABSTRACT

The present application discloses a test structure, a substrate and a method for manufacturing the substrate. The substrate includes a stacked substratum, a metal layer and an insulating layer; first via holes and second via holes disposed in different areas and passing through the insulating layer, and first transparent electrodes and second transparent electrodes disposed in different via holes and connected with the metal layer. The first via holes and the second via holes are formed through the same manufacture procedure, and the first transparent electrodes and the second transparent electrodes are formed through the same manufacture procedure.

13 Claims, 9 Drawing Sheets

(51) Int. Cl.
*G01N 27/20* (2006.01)
*H01L 21/66* (2006.01)

(52) U.S. Cl.
CPC .............. *H01L 22/14* (2013.01); *H01L 22/32* (2013.01); *H01L 22/34* (2013.01)

(58) Field of Classification Search
CPC ......... H01L 22/14; H01L 22/32; H01L 22/34; H01L 22/12
See application file for complete search history.

(56) References Cited

U.S. PATENT DOCUMENTS

| 11,011,085 B2* | 5/2021 | Lee ..................... H01L 27/3276 |
| 2017/0169153 A1* | 6/2017 | Hwang ................... H01L 22/20 |

FOREIGN PATENT DOCUMENTS

| CN | 103383938 A | 11/2013 |
| CN | 103413811 A | 11/2013 |
| CN | 104124235 A | 10/2014 |
| CN | 104143519 A | 11/2014 |
| CN | 106771726 A | 5/2017 |
| CN | 107104106 A | 8/2017 |
| CN | 110137154 A | 8/2019 |
| JP | 2010032726 A | 2/2010 |
| TW | 365046 B | 7/1999 |

* cited by examiner

FIG. 1

Schematic cross section AA'

TEST STRUCTURE, SUBSTRATE AND METHOD FOR MANUFACTURING SUBSTRATE

CROSS REFERENCE OF RELATED APPLICATIONS

The present application claims the priority to the Chinese Patent Application No. CN201910270645.X, filed with National Intellectual Property Administration, PRC on Apr. 4, 2019 and entitled "TEST STRUCTURE, SUBSTRATE AND METHOD FOR MANUFACTURING SUBSTRATE", which is incorporated herein by reference in its entirety.

TECHNICAL FIELD

The present application relates to the field of display technologies, and particularly to a test structure, a substrate and a method for manufacturing the substrate.

BACKGROUND

The statements herein merely provide background information related to the present application and do not necessarily constitute the conventional art.

With the development and advancement of science and technology, flat-panel displays have become the mainstream of display products due to their thin body, low power consumption and low radiation, and have been widely used. The flat-panel display includes a Thin Film Transistor-Liquid Crystal Display (TFT-LCD) and an Organic Light-Emitting Diode (OLED) Display, etc. In the manufacturing process of a liquid crystal panel, when an insulating layer on a Metal 2 (M2, S/D Metal) is etched to form via holes, passivation undercut may easily occur, that is, the bottoms of the via holes are undercut, which may cause abnormal display of liquid crystal panels and problems such as dark spots, affecting the quality of the liquid crystal panel.

In order to manufacture liquid crystal panels with better quality, each procedure needs strict control. At present, the most common monitoring mode is off-line detection, which needs a splitting test on the sample, and requires more labor and time, and an increased manufacturing cost.

SUMMARY

The present application is intended to provide a test structure, a substrate and a method for manufacturing the substrate, to realize quick on-line detection of passivation undercut on a panel.

For the above purpose, the present application discloses a substrate, divided into at least one display substrate area and an interval area located between the display substrate area, the interval area is provided with at least one test area. The substrate includes: a substratum; a metal layer disposed on the substratum; an insulating layer disposed on the metal layer; a plurality of first via holes disposed in the display substrate area and passing through the insulating layer of the display substrate area; at least one second via hole disposed in the test area and passing through the insulating layer of the test area; first transparent electrodes disposed on the insulating layer of the display substrate area and in the first via holes and connected with the metal layer; and second transparent electrodes disposed in the second via holes and connected with the metal layer. The first via holes and the second via holes are formed through the same manufacture procedure, and the first transparent electrodes and the second transparent electrodes are formed through the same manufacture procedure.

The present application further discloses a test structure configured for testing a display substrate area of a substrate, including second via holes synchronously formed with first via holes of the display substrate area, second transparent electrodes synchronously formed with first transparent electrodes of the display substrate area, and at least one conductor and at least two pads. The test structure includes more than one second via holes, the second transparent electrodes are disposed in the second via holes, the conductors connect the second transparent electrodes in different second via holes, and the pads are connected with the second transparent electrodes or the conductors.

The present application further discloses a method for manufacturing a substrate, including:
  forming a substratum in a display substrate area of a substrate and in a test area positioned outside the display substrate area;
  forming a metal layer on the substratum;
  forming an insulating layer on the metal layer;
  synchronously forming a plurality of first via holes and at least one second via hole, the first via holes pass through the insulating layer of the display substrate area, and the second via holes pass through the insulating layer of the test area;
  synchronously forming first transparent electrodes and second transparent electrodes, the first transparent electrodes are formed on the insulating layer of the display substrate area and in the first via holes, the second transparent electrodes are formed in the second via holes, and the first transparent electrodes and the second transparent electrodes are separately connected with the metal layer; and
  testing the second via holes and the second transparent electrodes in the test area.

Compared with the scheme of off-line detection of the passivation undercut condition on the display substrates, the present application, in which on-line detection is performed before the substrate is cut, reflects the passivation undercut condition of the via holes in the test area by detecting the resistance of the transparent electrodes in the via holes in the test area. The present application may find the passivation undercut condition of the via holes on the display substrate in a timely manner, and requires no off-line detection, thus saving time and labor and increasing the manufacture efficiency. Moreover, it is only necessary to perform a splitting test on a sample when an abnormality is found, resulting in a reduced scrapping rate and an elevated cost efficiency.

BRIEF DESCRIPTION OF DRAWINGS

The accompanying drawings, which are included to provide a further understanding of embodiments of the present application and constitute a part of the specification, illustrate embodiments of the application and, together with the text description, explain the principles of the application. Obviously, the drawings in the following description are merely some embodiments of the present application, and those skilled in the art can obtain other drawings according to the drawings without any inventive labor. In the drawings.

DETAILED DESCRIPTION OF EMBODIMENTS

It should be understood that the terminology, specific structural and functional details disclosed are merely exemplary for the purpose of describing specific embodiments. However, the present application may be embodied in many alternative forms and should not be construed as being limited to the embodiments set forth herein.

In the description of the present application, the terms "first" and "second" are only for the purpose of description and cannot be construed to indicate relative importance or imply an indication of the number of technical features indicated. Therefore, unless otherwise stated, a feature defined as "first" and "second" may explicitly or implicitly include one or more of the features; "multiple" means two or more. The term "include" and any variations thereof are intended to be inclusive in a non-closed manner, that is, the presence or addition of one or more other features, integers, steps, operations, units, components and/or combinations thereof may be possible.

In addition, the terms "center", "transverse", "up", "down", "left", "right", "vertical", "horizontal", "top", "bottom", "inner", "outer" and the like for indicating an orientation or positional relationship are based on the description of the orientation or relative positional relationship shown in the accompanying drawings, and are only simplified description facilitating description of the application, and are not intended to indicate that the device or element referred to must have a particular orientation, be configured and operated in a particular orientation, and therefore cannot be construed as limiting the present application.

In addition, unless expressly specified and defined otherwise, the terms "mount", "attach" and "connect" are to be understood broadly, for example, it can be a fixed connection, a detachable connection, or an integral connection; it can be an either mechanical connection or an electrical connection; it can be a direct connection or an indirect connection through an intermediate medium, or an internal connection between two elements. For those skilled in the art, the specific meaning of the above terms in this application can be understood according to the specific circumstances.

The present application will now be further described by reference to the accompanying drawings and optional embodiments.

As shown in FIGS. 1 to 4, an embodiment of the present application discloses a substrate 100 divided into at least one display substrate area 110 and a spacing area between the display substrate areas 110 provided with at least one test area 120. The substrate 100 includes: a substratum 112; a metal layer 130 disposed on the substratum 112; an insulating layer 140 disposed on the metal layer 130; a plurality of first via holes 150 disposed in the display substrate area 110 and passing through the insulating layer 140 of the display substrate area 110; at least one second via hole 160 disposed in the test area 120 and passing through the insulating layer 140 of the test area 120; first transparent electrodes 170 disposed on the insulating layer 140 of the display substrate area 110 and in the first via holes 150 and connected with the metal layer 130; and second transparent electrodes 180 disposed in the second via holes 160 and connected with the metal layer 130. The first via holes 150 and the second via holes 160 are formed through the same manufacture procedure, and the first transparent electrodes 170 and the second transparent electrodes 180 are formed through the same manufacture procedure.

Figure 1:
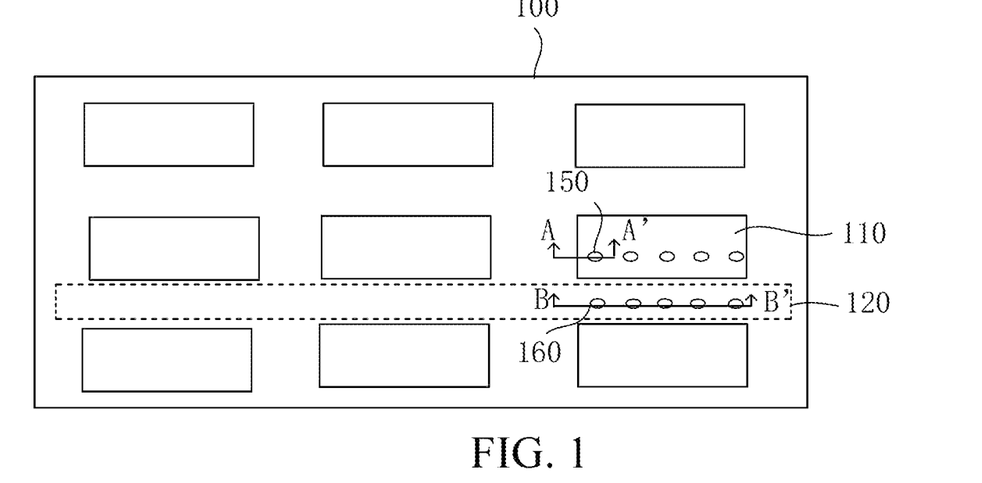
FIG. 1 is a schematic diagram of a substrate panel according to one embodiment of the present application.
Figure 2:
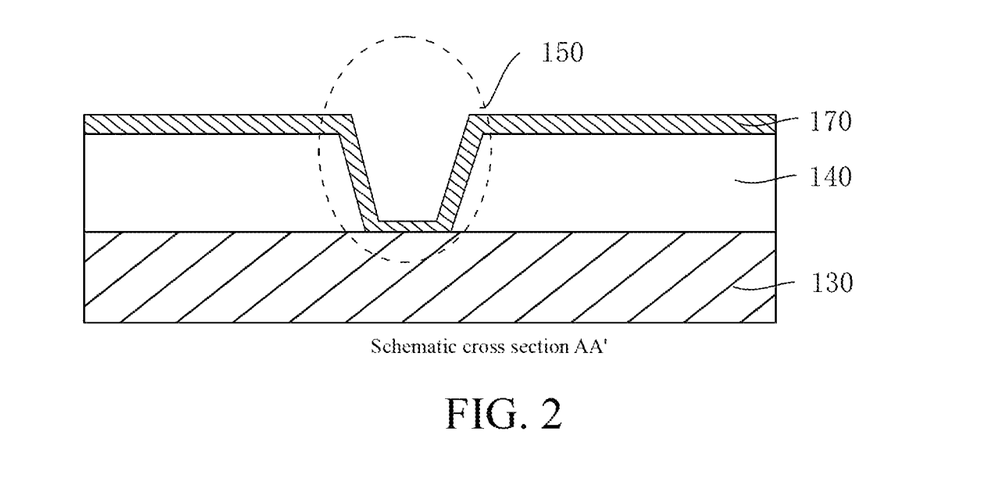
FIG. 2 is a schematic diagram of cross section AA' of FIG. 1.
Figure 3:
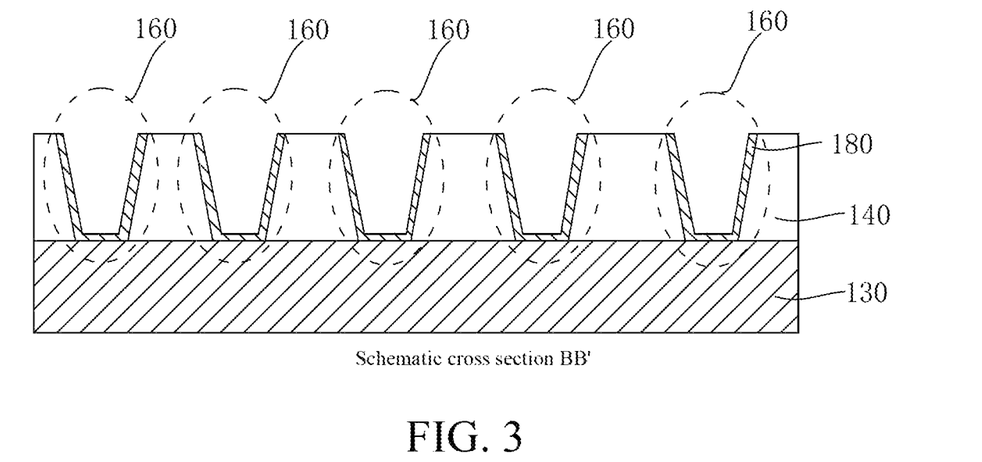
FIG. 3 is a schematic diagram of cross section BB' of FIG. 1.
Figure 4:
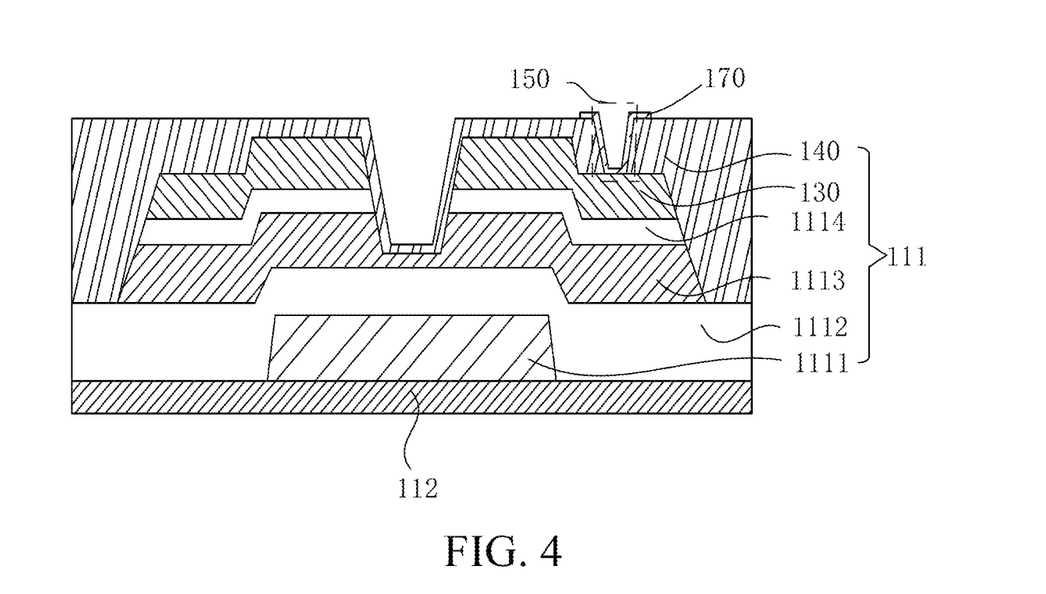
FIG. 4 is a schematic diagram of a display substrate area according to one embodiment of the present application.

The present application provides an on-line detection method, which detects the passivation undercut condition of the insulating layer 140 in the display substrates before the display substrate areas on the substrate 100 are split. FIG. 4 is a schematic diagram of a display substrate, or more specifically an array substrate, including an active switch 111. Other than the substratum 112, the metal layer 130, the insulating layer 140 and the first transparent electrodes 170 mentioned above, the display substrate further includes a gate metal layer 1111, a gate insulating layer 1112, an active layer 1113 and an ohmic contact layer 1114 disposed between the substratum 112 and the metal layer 130. In addition, the metal layer 130 is source and drain electrodes, and the insulating layer 140 is a passivation layer. The insulating layer 140 is etched to form first via holes 150. The first transparent electrodes 170 are connected with the metal layer 130 (drain electrode) through the first via holes 150. However, the first via holes 150 are prone to passivation undercut during etching.

Figure 5:
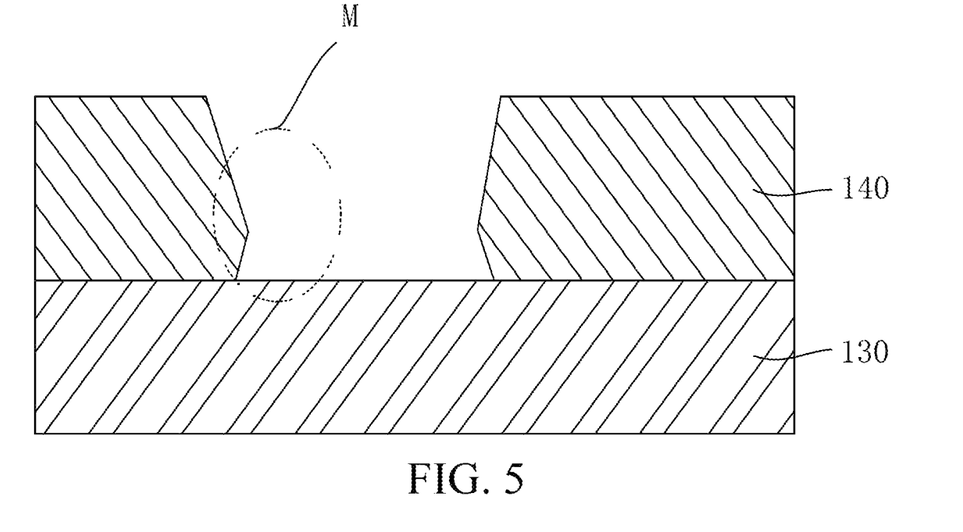
FIG. 5 is a schematic diagram of passivation undercut on an insulating layer according to one embodiment of the present application.

FIG. 5 is a schematic diagram of passivation undercut on the insulating layer 140, where M is a site of passivation undercut on the insulating layer 140. Passivation undercut may cause abnormal display of liquid crystal panels in a severe case, and may cause problems such as dark spots on the display of liquid crystal panels during use in a mild case, both compromising the quality of the liquid crystal panel.

Figure 6:
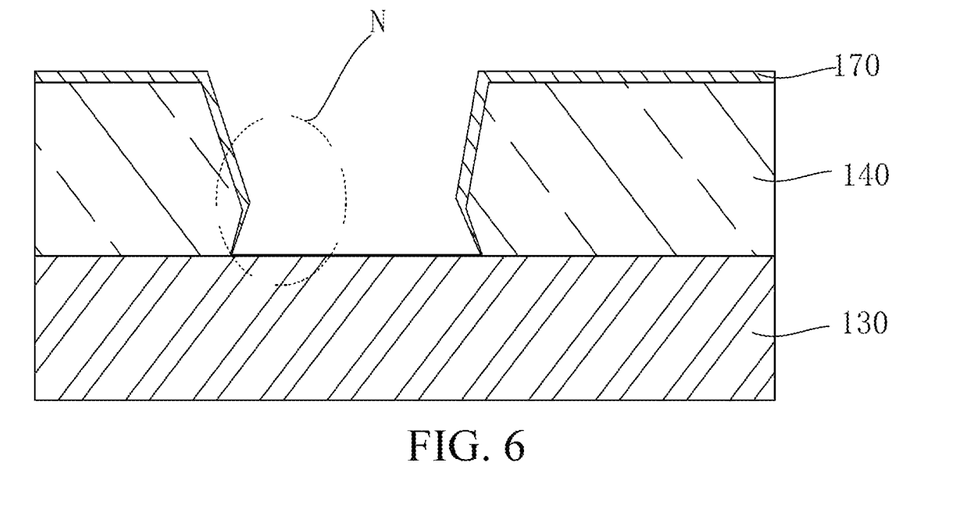
FIG. 6 is a schematic diagram of a transparent electrode layer affected by passivation undercut according to one embodiment of the present application.

FIG. 6 is a schematic diagram of the first transparent electrodes 170 laid on the insulating layer 140 where passivation undercut occurs. N is a portion of the first transparent electrodes 170 affected by passivation undercut. As can be seen in the figure, the thickness of the first transparent electrodes 170 in the first via holes 150 is not uniform, and the first transparent electrodes 170 in the undercut portion of the insulating layer 140 may even be broken, which may cause problems such as abnormal display of the display panels.

An exemplary method is an off-line detection of the problem of passivation undercut, that is, when passivation undercut occurs after the display substrate is cut and separated from the substrate 100, the display substrate is observed using a scanning electron microscope. This requires more labor and time, and a scrap split analysis on the sample, which increases the manufacturing cost. In the on-line detection of the present application, the insulating layer 140, the via holes and the transparent electrode structures on the display substrate area 110 are synchronously formed in the detection area on the substrate 100. The passivation undercut condition of the second via holes 160 is detected by testing the resistance of the second transparent electrodes 180 in the detection area, and the risks on the display substrate area 110 are reflected. The rationale is that when the second via holes 160 demonstrate passivation undercut, the second transparent electrodes 180 positioned therein are partially broken, which reduces the cross sections of the second transparent electrodes 180. It is known from the resistance formula R=PL/S (R is the resistance, P is the resistivity, L is the length of the resistor, and S is the cross-sectional area of the resistor) that the resistance of the second transparent electrodes 180 increases. When the resistance of the second transparent electrodes 180 becomes larger to a certain degree, through comparison with the normal resistance of the second transparent electrodes 180, it is inferred that the second via holes 160 have the problem of passivation undercut, and it is further assumed that the first via holes 150 may also have the risk of passivation undercut. Therefore, the manufacture cost is not increased, the production of the display substrates is not affected, the scrapping of the display substrates due to sampling detection is avoided, and detecting the display substrates one by one is no longer required. The condition of all the display substrates can be known through the detection result of the detection area, such that the production efficiency is greatly improved.

Figure 7:
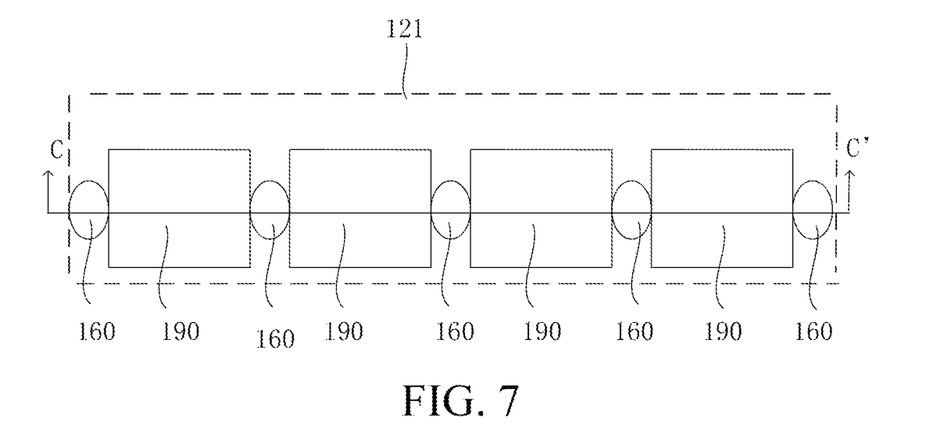
FIG. 7 is a schematic diagram of a test circuit according to one embodiment of the present application.
Figure 8:
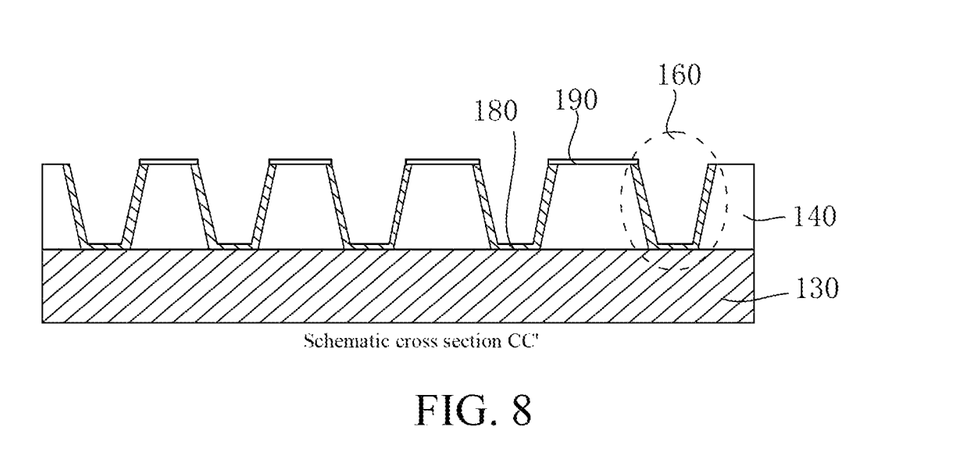
FIG. 8 is a schematic diagram of cross section CC' of FIG. 7.

As shown in FIGS. 7 and 8, in one or more embodiments, the test structure includes more than one second via holes 160. The substrate 100 includes at least one conductor 190, each of the conductors 190 is disposed between adjacent second via holes 160 and is connected with the second transparent electrodes 180 in the adjacent second via holes 160. The connected conductors 190 and the second transparent electrodes 180 form a test circuit 121. If there is only one second via hole 160, even if the second via hole 160 does not demonstrate passivation undercut, it cannot be concluded that the display substrate area 110 on the whole substrate 100 has no risk of passivation undercut. The risk of passivation undercut in the display substrate area 110 can be reflected more accurately only by increasing the number of the second via holes 160. When a number of second via holes 160 do not demonstrate passivation undercut, it can be inferred that the probability of first via holes 150 on the display substrate area 110 having the risk of passivation undercut is sufficiently low, and when a certain number of second via holes 160 show passivation undercut, it can be inferred that the probability of the first via holes 150 having the problem of passivation undercut is relatively high. According to the test result of the applicant, the number of the second via holes 160 is at least greater than five, which makes the test result more accurate. In order to avoid measuring the resistance of the second via holes 160 one by one, the two adjacent second via holes 160 are connected by the conductor 190 to form the test circuit 121, such that whether the resistance of the second transparent electrodes 180 is increased or not in the test circuit 121 can be directly known by measuring the resistance of the whole test circuit 121. Thus it is determined that passivation undercut occurs in the second via holes 160, demonstrating that the first via holes 150 in the display substrate area 110 may have the risk of passivation undercut.

More specifically, the conductors 190 and the second transparent electrodes 180 may be made of the same material, for example, an indium tin oxide (ITO) material. As such, the conductors 190 can be formed while the first transparent electrodes 170 and the second transparent electrodes 180 are deposited on the whole substrate 100. In this step, the conductors may be produced by patterning the conductors 190 on a mask only on the basis of etching the patterns of the first transparent electrodes 170 and the second transparent electrodes 180, such that the conductors 190 may remain the patterns when the transparent electrodes of the whole substrate 100 are etched. This does not increase the duration of the manufacture procedure nor pose any additional cost. Of course, the conductors 190 may also be made of other conductive materials, such as silver and copper, which have good conductive effects. Metal conductive materials may be selected because the metal material may not easily break, and thus interference during detection is avoided. Metal conductive materials also feature desirable conductivity, such that the influence of the resistance of the conductors 190 in the test circuit 121 on the resistance of the second transparent electrodes 180 can be reduced.

In addition, the width of the conductors 190 is greater than the diameter of the second via holes 160. As can be seen from the resistance formula R=PL/S, reducing the resistance can be realized by using a material with a better conductive effect, that is, by reducing P (resistivity), and by reducing the length (L) of the resistance or increasing the cross-sectional areas (S) of the conductors 190. In order to reduce the influence of the resistance of the conductors 190 in the test circuit 121 on the resistance of the second transparent electrodes 180 without changing the material of the conductors 190, the cross-sectional areas of the conductors 190 may be increased, and thus the width of the conductors 190 is increased, such that the width of the conductors 190 is greater than the diameter of the second via holes 160, which reduces the resistance of the conductors 190. By testing, the applicant found that when the width of the conductors 190 is greater than ten times the diameter of the second via holes 160, the influence of the resistance of the conductors 190 on the whole test circuit 121 may be reduced significantly. The resistance can also be reduced by reducing the length of the conductors 190, and the length of the conductors 190 depends on the spacing between the second via holes 160. When the spacing of adjacent second via holes 160 is increased, conductors 190 with a longer length are required, and conductors 190 with a shorter length are required to be connected when the spacing of adjacent second via holes 160 is reduced. In the present application, the spacing between the adjacent second via holes 160 is less than the diameter of the second via holes 160, such that the influence of the conductors 190 on the resistance of the whole test circuit 121 is significantly reduced. In the present application, one or more methods for reducing the resistance of conductors 190 can be adopted, which is not limited here. A width of the conductors 190 greater than ten times the diameter of the second via holes 160 is selected, and spacing between the adjacent second via holes 160 is less than the diameter of the second via holes 160. As such, the influence of the conductors 190 on the resistance of the whole test circuit 121 is reduced to a minimum extent.

Figure 9:
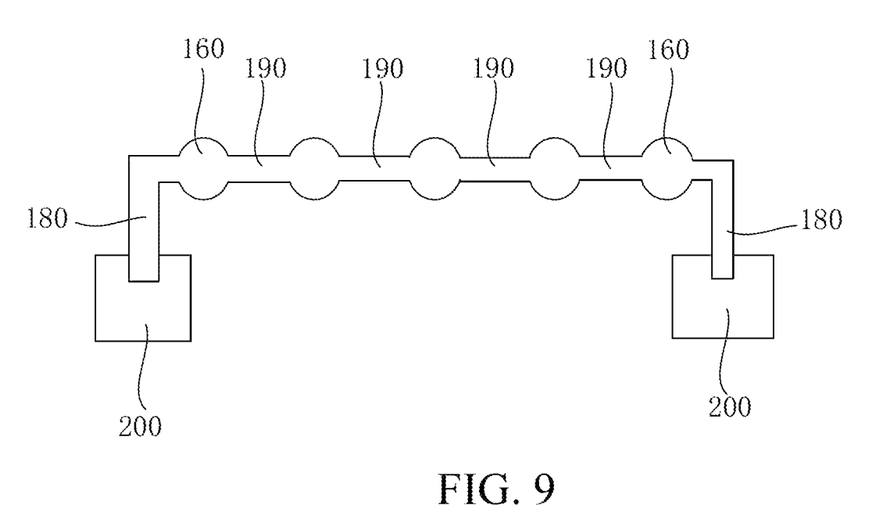
FIG. 9 is a schematic diagram of a substrate according to another embodiment of the present application.

In one or more embodiments, as shown in FIG. 9, the substrate 100 includes at least two pads 200. The pads 200 are disposed at both ends of the test circuit 121. The pads 200 can be connected with the second transparent electrodes 180 at both ends of the test circuit 121, that is, the pads 200 are in communication with the second transparent electrodes 180 in the second via holes 160. The second transparent electrodes 180, when being deposited in the second via holes 160, can be deposited on the insulating layer 140 and in communication with those second transparent electrodes 180 in the second via holes 160. The pads 200 may also be connected with the conductors in the test circuit 121. In order to measure the resistance of the test circuit 121, an external detection device is needed to electrify the test circuit 121. The resistance of the test circuit 121 is calculated using a formula of R=U/I (U is voltage, I is current). Since the area of the via holes and the test circuit 121 is relatively small, a small contact interface is needed to connect both ends of the test circuit 121 for electrifying. As such, a probe under may be selected as the contact interface of the detection device, which can meet the requirement. However, the probe is relatively sharp. If the probe is directly connected with the test circuit 121, the second transparent electrodes 180 on the test circuit 121 may be penetrated. Since the transparent electrodes are transparent, whether the probe penetrates through the electrodes is not easily notified, posing influence on the measurement. Therefore, a medium, that is, the pads 200, is needed. When directly contacting the probe, due to the large area of the pads 200, the pads 200 can easily find a connection point, and the pads 200 are favorable for observing penetration. Thus, all problems of the probe connecting the second transparent electrodes 180 can be overcome. As such, the pads 200 are disposed on the substrate 100, i.e., the pads 200 are disposed at both ends of the test circuit 121, and the detection device tests the resistance of the whole test circuit 121 through the pads 200. It should be noted that, the case of directly detecting the test circuit 121 using the detection device is also included in the present application, that is, connections through the pads 200 are not required. As such, the manufacture procedure may be simplified and the production efficiency can be improved.

Figure 10:
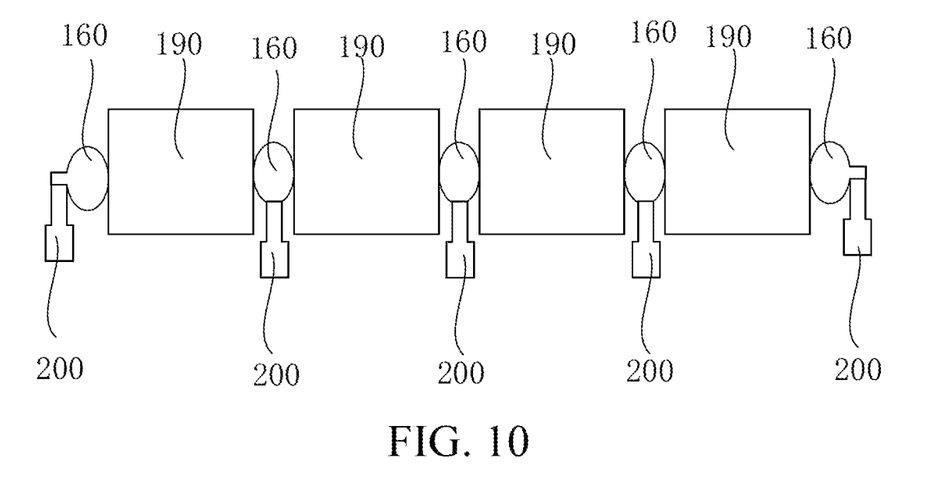
FIG. 10 is a schematic diagram of a substrate according to another embodiment of the present application.

As shown in FIG. 10, in the present application, the pads 200 are not necessarily disposed at both ends of the test circuit 121, and the pads 200 may be disposed at other places of the test circuit 121, and even each of the second via holes 160 of the test circuit 121 may be disposed with the pads 200 connected with the corresponding second transparent electrodes 180. As such, the pads 200 at both ends of the test circuit 121 may be connected by the probe. If passivation undercut is found, the range of the test circuit 121 may be continuously reduced, until the second via holes 160 with passivation undercut is found. Finally, by detecting the certain via hole the specific situation may be figured out, without cutting excessive portions.

Figure 11:
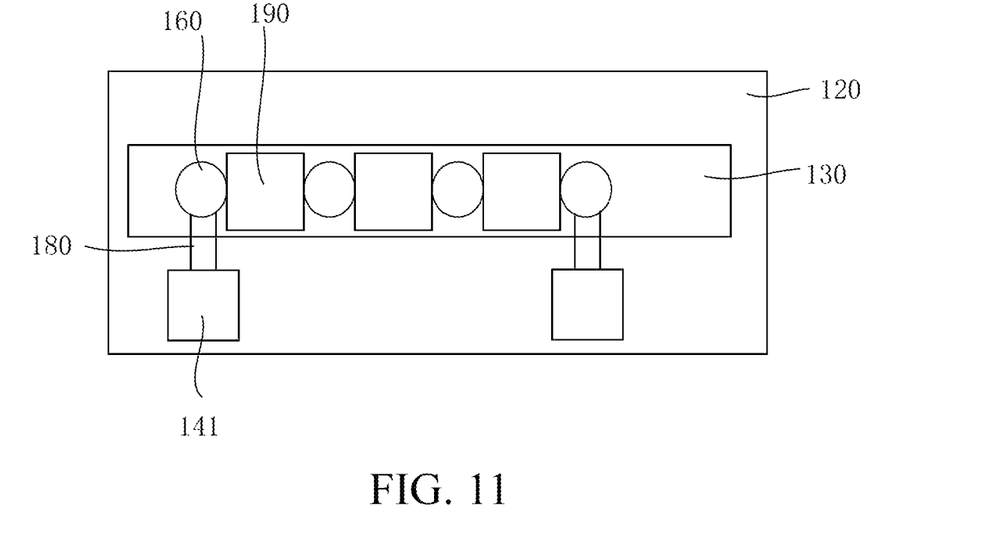
FIG. 11 is a schematic diagram of a substrate according to another embodiment of the present application.
Figure 12:
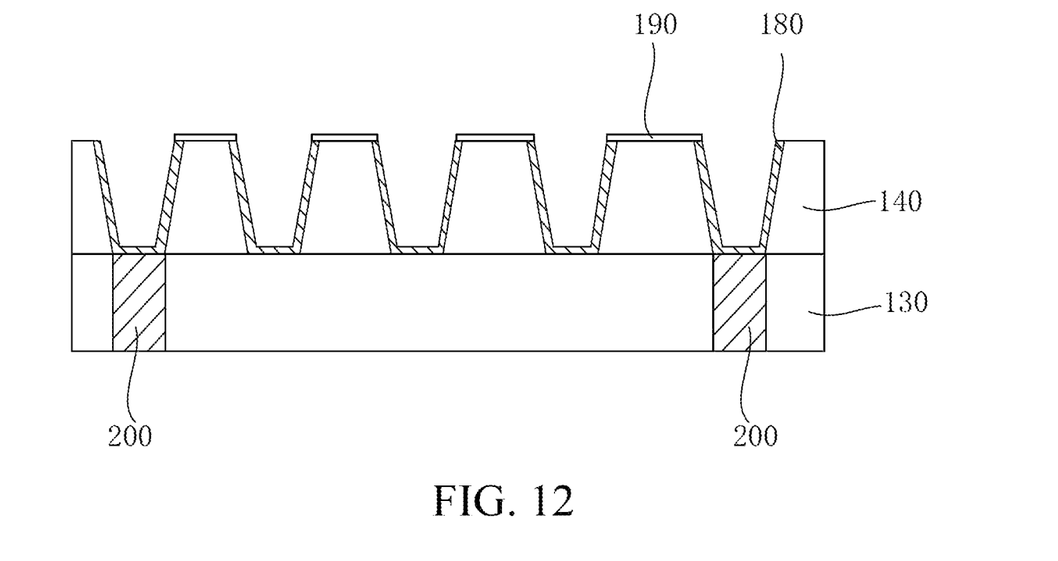
FIG. 12 is a schematic diagram of a cross section of FIG. 11.
Figure 13:
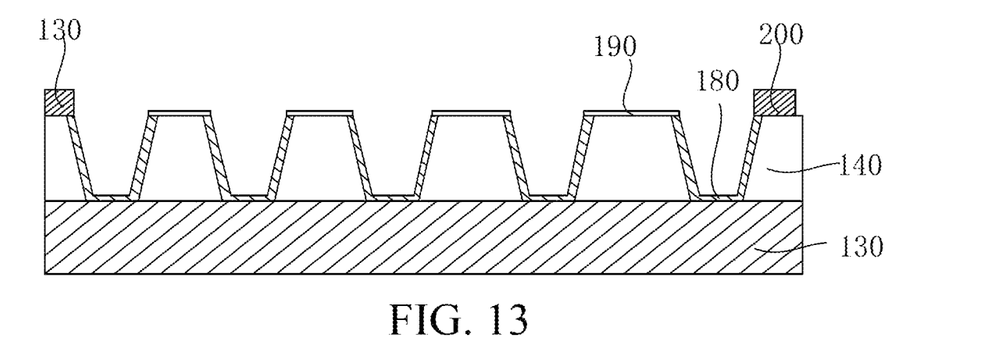
FIG. 13 is a schematic diagram of a substrate according to another embodiment of the present application.

As shown in FIGS. 11 and 12, in one or more embodiments, the pads 200 and the metal layer 130 are formed through the same manufacture procedure. However, the two are not connected with each other. The pads 200 are etched at the same time when first via holes 150 and second via holes 160 are etched. Through holes 141 are disposed at positions of the insulating layer 140 corresponding to the pads 200, and the second transparent electrodes 180 are connected with the pads 200 through the through holes 141. This does not increase the manufacture procedures for forming the pads 200, thus reducing the overall time of manufacture procedure. As shown in FIG. 13, the pads 200 may be formed after the second transparent electrodes 180 are formed. The pads 200 are made of a metal material and formed on the second transparent electrodes 180, such that the pads can be directly communicated with the second transparent electrodes. The pads 200 are disposed on the second transparent electrodes 180, which facilitates the connection of the probe. In addition, the pads can also be disposed between the insulating layer 140 and the second transparent electrodes 180. That is, the pads 200 are formed after the insulating layer 140 is formed, and finally the second transparent electrodes 180 are formed. The pads 200 are made of a conductive material, and the second transparent electrodes 180 cover the pads 200 and are connected with the pads 200, which facilitates the connection of the probe.

Figure 14:
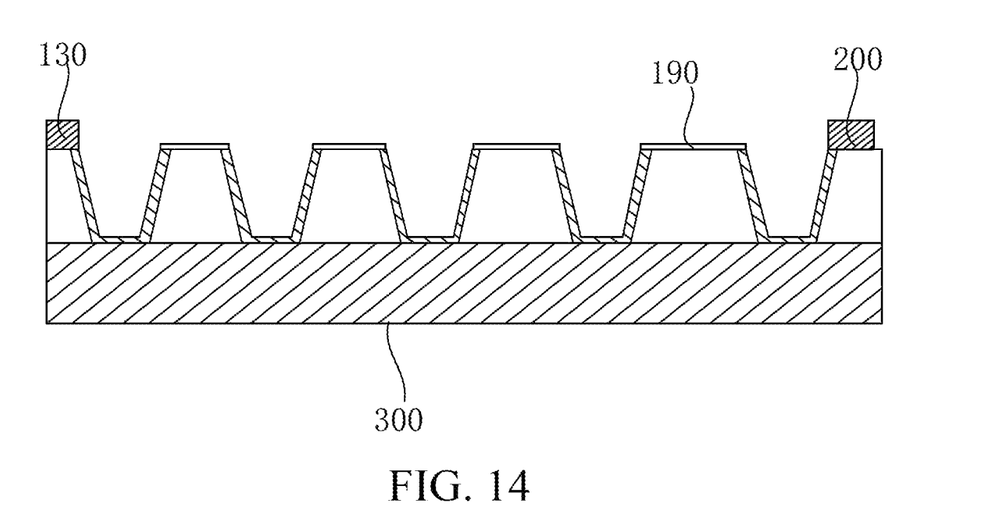
FIG. 14 is a schematic diagram of a test structure according to another embodiment of the present application.

As shown in FIG. 14, as another embodiment of the present application, a test structure 300 is disclosed for testing a display substrate area 110 of a substrate 100, including second transparent electrodes 180 synchronously formed with first transparent electrodes 170 of the display substrate area 110, second via holes 160 synchronously formed with first via holes 150 of the display substrate area 110, and at least one conductor 190 and at least two pads 200. The test structure includes more than one second via holes 160, the second transparent electrodes 180 are disposed in the via holes, the conductors 190 connect the second transparent electrodes 180 in different second via holes 160, and the pads 200 are connected with the second transparent electrodes 180 or the conductors 190. The test structure 300 not only works on the substrate 100, but also works outside the substrate 100. If it is uncertain whether the produced display substrate has passivation undercut or not, the via holes and the transparent electrodes can be formed outside the display substrates synchronously with those on the display substrates, and then the resistance of the transparent electrodes of the test structure 300 can be measured by connecting the probe of the detection device with the pads 200, so as to detect the passivation undercut of the display substrates according to the situation.

Figure 15:
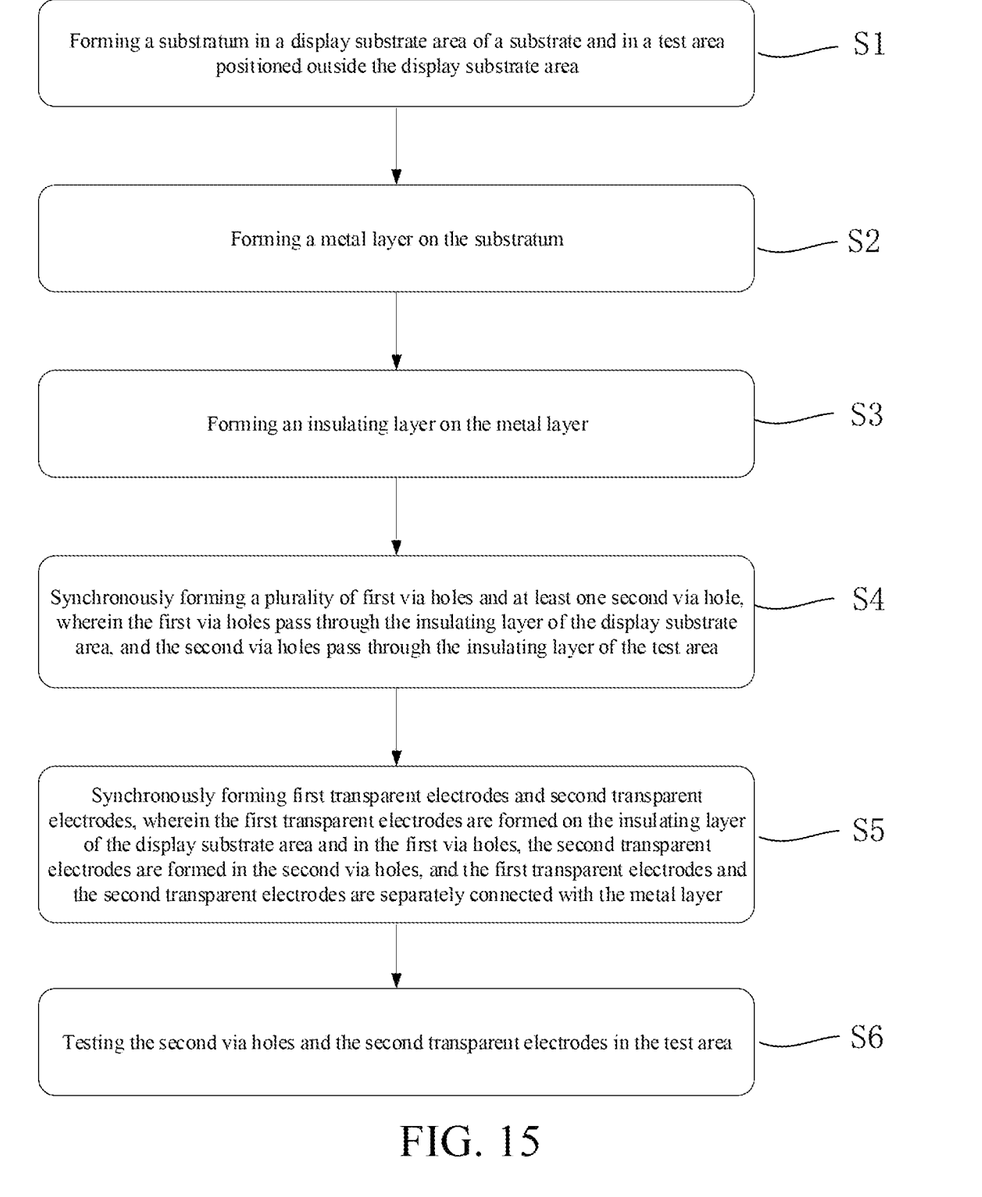
FIG. 15 is a flowchart of a method for manufacturing a substrate according to another embodiment of the present application.

As shown in FIG. 15, as another embodiment of the present application, a method for manufacturing a substrate is disclosed, including:

S1, forming a substratum in a display substrate area of a substrate and in a test area positioned outside the display substrate area;

S2, forming a metal layer on the substratum;

S3, forming an insulating layer on the metal layer;

S4, synchronously forming a plurality of first via holes and at least one second via hole, the first via holes pass through the insulating layer of the display substrate area, and the second via holes pass through the insulating layer of the test area;

S5, synchronously forming first transparent electrodes and second transparent electrodes, the first transparent electrodes are formed on the insulating layer of the display substrate area and in the first via holes, the second transparent electrodes are formed in the second via holes, and the first transparent electrodes and the second transparent electrodes are separately connected with the metal layer; and S6, testing the second via holes and the second transparent electrodes in the test area.

Figure 16:
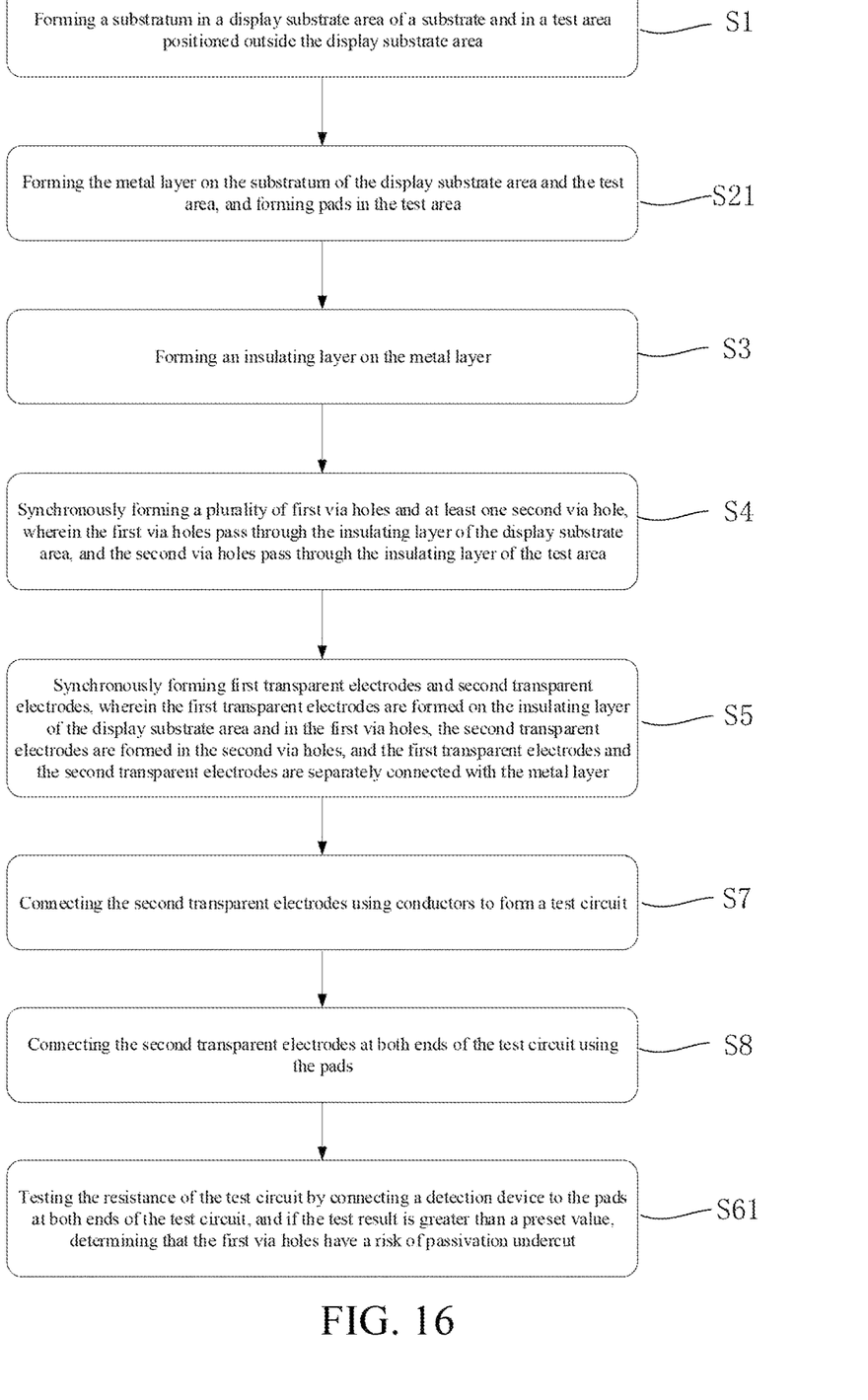
FIG. 16 is a flowchart of another method for manufacturing a substrate according to another embodiment of the present application.

As shown in FIG. 16, S2 further includes:

S21: forming the metal layer on the substratum of the display substrate area and the test area, and forming pads in the test area.

After step S5, the method further includes:

S7, connecting the second transparent electrodes using conductors to form a test circuit; and S8, connecting the second transparent electrodes at both ends of the test circuit using the pads.

S6 further includes:

S61, testing the resistance of the test circuit by connecting a detection device to the pads at both ends of the test circuit; and if the test result is greater than a preset value, determining that the first via holes have a risk of passivation undercut.

In step S61, if the first via holes 150 have the risk of passivation undercut, splitting the test circuit 121, and observing the passivation undercut condition of the second via holes 160 using an electron microscope; and if the first via holes 150 have no risk of passivation undercut, cutting the substrate 100 to form a plurality of the display substrates for the next manufacture procedure. The preset value mentioned in step S61 is 15% of the standard resistance, where the standard resistance is the normal resistance of the second transparent electrodes 180 in the test circuit 121. The resistance of the test circuit 121 may be greater than the normal resistance of the second transparent electrodes 180 in the test circuit 121 due to the influence of the resistance of the conductors 190. However, if the resistance of the test circuit 121 is greater than the normal resistance of the transparent electrodes in the test circuit 121 by 15%, other factors in addition to the conductors 190 may contribute to the larger resistance of the test circuit 121. Since the resistance of the second transparent electrodes 180 is increased due to passivation undercut, it can be concluded that the second via holes 160 in the test circuit 121 have passivation undercut, further demonstrating that the display substrate area 110 has passivation undercut. As for the condition of observing the via holes in the cross section after the display substrate area 110 or the test circuit 121 is cut and split, the observation can be performed by SEM (scanning electron microscope), FIB (Focused Ion beam) and the like. The tool for cutting the substrate 100 may be a glass knife.

Of course, the present application is also feasible to directly test the second via holes and the second transparent electrodes in the test area without using the pads.

It should be noted that, the limitation of the steps involved in this solution, without affecting the implementation of the specific solution, is not determined to limit the sequence of steps, and the previous steps may be executed first, later, or even simultaneously, and shall be deemed to fall within the scope of the present application as long as the solution can be implemented.

The technical scheme of the present application can be widely used in various display panels, such as Twisted Nematic (TN) display panels, In-Plane Switching (IPS) display panels, Vertical Alignment (VA) display panels and Multi-Domain Vertical Alignment (MVA) display panels, and, of course, other types of display panels, such as Organic Light-Emitting Diode (OLED) display panels.

The above content is a further detailed description of the present application in conjunction with specific, optional embodiments, and it is not to be construed that specific embodiments of the present application are limited to these descriptions. For those of ordinary skill in the art to which this application belongs, a number of simple derivations or substitutions may be made without departing from the spirit of this application, all of which shall be deemed to fall within the scope of this application.

What is claimed is:

1. A substrate, divided into at least one display substrate area and an interval area located between the at least one display substrate area, wherein the interval area is provided with at least one test area, the substrate comprising:
   a sub stratum;
   a metal layer disposed on the substratum;
   an insulating layer disposed on the metal layer;
   a plurality of first via holes disposed in the display substrate area and passing through the insulating layer of the display substrate area;
   at least one second via hole disposed in the at least one test area and passing through the insulating layer of the at least one test area;
   a plurality of first transparent electrodes disposed on the insulating layer of the display substrate area and in the plurality of first via holes and connected with the metal layer; and
   a plurality of second transparent electrodes disposed in the at least one second via hole and connected with the metal layer;
   wherein the plurality of first via holes and the at least second via hole are formed through the same manufacture procedure, and the plurality of first transparent electrodes and the plurality of second transparent electrodes are formed through the same manufacture procedure;
   wherein the substrate comprises more than one second via hole and further comprises at least one conductor, wherein each of the at least one conductor is connected with at least two of the plurality of second transparent electrodes corresponding to the second via holes; and wherein the at least one conductor and the corresponding connected second transparent electrodes form a test circuit;
   wherein the substrate further comprises at least two pads, wherein the at least two pads are disposed at both ends of the test circuit and are connected with the second transparent electrodes or the at least one conductor;
   wherein the at least two pads and the metal layer are formed through the same manufacture procedure, and the at least two pads are not connected with the metal layer; and
   the insulating layer is provided with a through hole at a position corresponding to each of the at least two pads, and the plurality of second transparent electrodes are connected with the at least two pads through the respective through holes.

2. The substrate according to claim 1, comprising more than 5 second via holes.

3. The substrate according to claim 1, wherein the conductors and the second transparent electrodes are made of the same material.

4. The substrate according to claim 1, wherein the conductors are made of a metallic material.

5. The substrate according to claim 1, wherein the width of the conductors is greater than the diameter of the second via holes.

6. The substrate according to claim 5, wherein the width of the conductors is greater than ten times the diameter of the second via holes.

7. The substrate according to claim 1, wherein the spacing between adjacent second via holes is less than the diameter of the second via holes.

8. A test structure configured for testing at least one display substrate area of a substrate, comprising second via holes synchronously formed in an interval area with first via holes of the display substrate area, the interval area being located between the at least one display substrate area and comprising at least one test area, second transparent electrodes synchronously formed with first transparent electrodes of the display substrate area, and at least one conductor and at least two pads, wherein the test structure comprises more than one second via hole, the second transparent electrodes are disposed in the second via holes, the at least one conductor connects the second transparent electrodes in different second via holes, and the at least two pads are connected with the second transparent electrodes or the at least one conductor;

wherein the substrate further comprises a substratatum, a metal layer disposed on the substratum, and an insulating layer disposed on the metal layer; wherein the first via holes are disposed in the at least one display substrate area and pass through the insulating layer of the display substrate area, the second via holes are disposed in the at least one test area and pass through the insulating layer of the at least one test area; wherein the first transparent electrodes are disposed on the insulating layer of the display substrate area and in the first via holes, the second transparent electrodes are disposed in the second via holes and are connected with the metal layer;

wherein the at least two pads and the metal layer are formed through the same manufacture procedure, and the at least two pads are not connected with the metal layer; and the insulating layer is provided with a through hole at a position corresponding to each of the at least two pads, and the second transparent electrodes are connected with the at least two pads through the respective through holes.

9. A method for manufacturing a substrate, comprising:
forming a substratum in a display substrate area of a substrate and in a test area positioned outside the display substrate area;
forming a metal layer on the substratum;
forming an insulating layer on the metal layer;
synchronously forming a plurality of first via holes and at least one second via hole, wherein the first via holes pass through the insulating layer of the display substrate area, and the second via holes pass through the insulating layer of the test area;
synchronously forming first transparent electrodes and second transparent electrodes, wherein the first transparent electrodes are formed on the insulating layer of the display substrate area and in the first via holes, the second transparent electrodes are formed in the at least one second via hole, and wherein the first transparent electrodes and the second transparent electrodes are separately connected with the metal layer; and
testing the at least one second via hole and the second transparent electrodes in the test area;

wherein forming a metal layer on the substratum comprises:
forming the metal layer on the substratum of the display substrate area and the test area, and forming pads in the test area;
after synchronously forming first transparent electrodes and second transparent electrodes, wherein the first transparent electrodes are formed on the insulating layer of the display substrate area and in the plurality of first via holes, the second transparent electrodes are formed in the at least one second via hole, and wherein the first transparent electrodes and the second transparent electrodes are separately connected with the metal layer, the method further comprises: connecting the second transparent electrodes using conductors to form a test circuit; and connecting the second transparent electrodes at both ends of the test circuit using the pads; and
wherein testing the at least one second via hole and the second transparent electrodes in the test area comprises: testing a resistance of the test circuit by connecting a detection device to the pads at both ends of the test circuit; and in response to a test result being greater than a preset value, determining that the first via holes have a risk of passivation undercut.

10. The method for manufacturing a substrate according to claim 9, wherein testing the resistance of the test circuit by connecting a detection device to the pads at both ends of the test circuit; and if the test result is greater than a preset value, determining that the first via holes have a risk of passivation undercut, comprises: if the first via holes have the risk of passivation undercut, splitting the test circuit, and observing the passivation undercut condition of the second via holes using an electron microscope; and if the first via holes have no risk of passivation undercut, cutting the substrate to form a plurality of the display substrates.

11. The method for manufacturing a substrate according to claim 9, wherein testing the resistance of the test circuit by connecting a detection device to the pads at both ends of the test circuit; and if the test result is greater than a preset value, determining that the first via holes have a risk of passivation undercut, comprises: the preset value is 15% of the standard resistance, wherein the standard resistance is the normal resistance of the second transparent electrodes in the test circuit.

12. The method for manufacturing a substrate according to claim 10, wherein the electron microscope comprises at least one of scanning electron microscope and focused ion beam.

13. The method for manufacturing a substrate according to claim 10, wherein the tool for cutting the substrate comprises a glass knife.

* * * * *